(12) United States Patent
Kim et al.

(10) Patent No.: US 8,884,446 B2
(45) Date of Patent: Nov. 11, 2014

(54) SEMICONDUCTOR PACKAGES

(71) Applicant: Samsung Electronics Co., Ltd, Suwon-Si (KR)

(72) Inventors: Young-lyong Kim, Gunpo-si (KR); Seong-ho Shin, Hwaseong-si (KR); Jae-gwon Jang, Hwaseong-si (KR); Jong-ho Lee, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/792,942

(22) Filed: Mar. 11, 2013

(65) Prior Publication Data

US 2013/0256917 A1      Oct. 3, 2013

(30) Foreign Application Priority Data

Mar. 28, 2012   (KR) .................. 10-2012-0031825

(51) Int. Cl.
*H01L 23/48*   (2006.01)
*H01L 23/00*   (2006.01)

(52) U.S. Cl.
CPC ....... *H01L 24/46* (2013.01); *H01L 2224/48227* (2013.01); *H01L 2224/73265* (2013.01); *H01L 2224/49113* (2013.01); *H01L 2224/49175* (2013.01); *H01L 2924/15311* (2013.01); *H01L 2224/48091* (2013.01); *H01L 2224/32145* (2013.01)
USPC ............ 257/777; 257/E23.085; 257/E23.006; 257/E25.021; 257/E25.027

(58) Field of Classification Search
USPC .......... 257/685, 686, 723, 777, 726, E25.031, 257/E25.032, E23.042, E25.005, E25.006, 257/E25.013, E25.021, E25.027, E25.042, 257/E23.085; 438/109, 28, 66, 67, 107, 438/406, 455–459, FOR. 368, FOR. 426
See application file for complete search history.

(56) References Cited

U.S. PATENT DOCUMENTS

| | | | |
|---|---|---|---|
| 6,630,744 B2 | 10/2003 | Tsuda | |
| 7,633,505 B1 | 12/2009 | Kelleher | |
| 7,927,919 B1 | 4/2011 | Fan et al. | |
| 8,320,149 B2 * | 11/2012 | Tang et al. ................ | 365/63 |
| 8,362,624 B2 * | 1/2013 | Kang et al. ................ | 257/774 |
| 2003/0209809 A1 * | 11/2003 | Lasky et al. ................ | 257/778 |
| 2006/0076690 A1 * | 4/2006 | Khandros et al. ............ | 257/777 |
| 2009/0321501 A1 | 12/2009 | Liang et al. | |
| 2011/0237026 A1 | 9/2011 | Farooq et al. | |
| 2011/0286254 A1 | 11/2011 | Yu et al. | |

FOREIGN PATENT DOCUMENTS

| | | |
|---|---|---|
| JP | 2011199075 A | 10/2011 |
| KR | 20100011613 A | 2/2010 |
| KR | 20100036064 A | 4/2010 |
| KR | 20100066849 A | 6/2010 |
| KR | 20110046891 A | 5/2011 |
| KR | 20110088931 A | 8/2011 |

* cited by examiner

*Primary Examiner* — Jasmine Clark
(74) *Attorney, Agent, or Firm* — Harness, Dickey & Pierce, P.L.C.

(57) ABSTRACT

A semiconductor package includes a master chip and a slave chip stacked on a substrate. The master chip and the slave chip are connected to one another by a bonding wire. The master chip and the slave chip are connected in series with an external circuit. The semiconductor package may have a low loading factor and excellent performance, and may be mass produced at low costs.

19 Claims, 10 Drawing Sheets

SEMICONDUCTOR PACKAGES

CROSS-REFERENCE TO RELATED APPLICATIONS

This application claims the benefit of Korean Patent Application No. 10-2012-0031825, filed on Mar. 28, 2012, in the Korean Intellectual Property Office, the disclosure of which is incorporated herein in its entirety by reference.

BACKGROUND

Inventive concepts relate to a semiconductor package, and more particularly, to a semiconductor package that may be mass-produced at low manufacturing costs and has excellent performance.

As semiconductor devices are manufactured to be lightweight, thin and simplified, there is an increasing demand for high-speed operation. Such a demand on a single semiconductor chip can be satisfied by optimizing the design of semiconductor devices and appropriately selecting materials for semiconductor devices, whereas, when a single semiconductor device is configured by stacking multiple semiconductor chips, a loading factor may be problematic. In addition, a through silicon via (TSV) or a chip-on-chip (CoC), which has been proposed to reduce the loading factor, incurs time-consuming manufacturing processes and high manufacturing costs.

SUMMARY

Inventive concepts provide a semiconductor package that has a low loading factor and excellent performance that may be mass-produced at low costs.

According to at least one example embodiment, a semiconductor package a master chip and a slave chip stacked on a substrate. The master chip and the slave chip may be connected to one another by a bonding wire. The master chip and the slave chip may be connected in series with an external circuit.

According to at least one example embodiment, the master chip includes a control circuit configured to control data and a signal input to and output from the slave chip.

According to at least one example embodiment, a footprint of the master chip is substantially the same as a footprint of the slave chip.

According to at least one example embodiment, the semiconductor package may further include a first dummy pad on the substrate, a first bonding wire connecting the master chip and the first dummy pad; and a second bonding wire connecting the slave chip and the first dummy pad.

According to at least one example embodiment, the master chip and the slave chip are configured to communicate with each other through the first dummy pad.

According to at least one example embodiment, the slave chip is at least two slave chips, and each of the at least two slave chips is connected in series to the substrate and the master chip.

According to at least one example embodiment, each of the at least two slave chips is connected to the first dummy pad by a bonding wire.

According to at least one example embodiment, the semiconductor package further includes a second dummy pad on the substrate. The master chip may be connected to the first dummy pad and the second dummy pad by bonding wires, and the at least two slave chips may be connected to any one of the first dummy pad and the second dummy pad.

According to at least one example embodiment, the master chip and the at least two slave chips are connected to each other by a single channel.

According to at least one example embodiment, the master chip is directly on the substrate, a footprint of the master chip is substantially larger than a footprint of the slave chip, and the master chip and the slave chip are directly connected to each other by a bonding wire.

According to at least one example embodiment, at least one of the master chip and the slave chip comprises a driver circuit configured to compensate for a delay in transmission of data or a signal.

According to at least one example embodiment, a semiconductor packing includes a master chip and a slave chip stacked on a substrate. The master chip and the slave chip may be connected to one another through a dummy pad disposed on the substrate, and connected in series with an external circuit.

According to at least one example embodiment, a footprint of the master chip is substantially the same as a footprint of the slave chip.

According to at least one example embodiment, the semiconductor package further includes a first bonding wire connecting the master chip and the dummy pad, and a second bonding wire connecting the slave chip and the dummy pad.

According to at least one example embodiment, the master chip is at least two master chips and the slave chip is at least two slave chips, and the at least two master chips and the at least two slave chips are connected in series.

According to at least one example embodiment, a semiconductor package includes a first chip group. The first chip group may include a first master chip and at least one first slave chip sequentially stacked on a substrate, at least one first bonding wire connecting the first master chip to the substrate, and at least one second bonding wire connecting the at least one first slave chip to the substrate. The at least one second bonding wire may be located on a different edge of the first master chip than the at least one first bonding wire, and the first master chip and the at least one first slave chip may be connected in series with one another and an external circuit.

According to at least one example embodiment, the semiconductor package further includes a second chip group stacked on the first chip group. The second chip group may include at least one second slave chip and a second master chip on the first chip group, at least one third bonding wire connecting the second master chip to the substrate, and at least one fourth bonding wire connecting the at least one second slave chip to the substrate. The at least one fourth bonding wire may be located on a different edge of the second master chip than the at least one third bonding wire, and the second master chip and the at least one second slave chip may be connected in series with one another and the external circuit.

According to at least one example embodiment, the at least one first slave chip and the at least one second slave chip each include a plurality of slave chips, and the at least one second bonding wire and the at least one fourth bonding wire each include a plurality of bonding wires connecting the plurality of slave chips to the substrate.

According to at least one example embodiment, the at least one first bonding wire and the at least one third bonding wire transmit signals between the external circuit and the first and second master chips.

According to at least one example embodiment, the first chip group and the second chip group have a substantially same footprint.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Figure 1A:
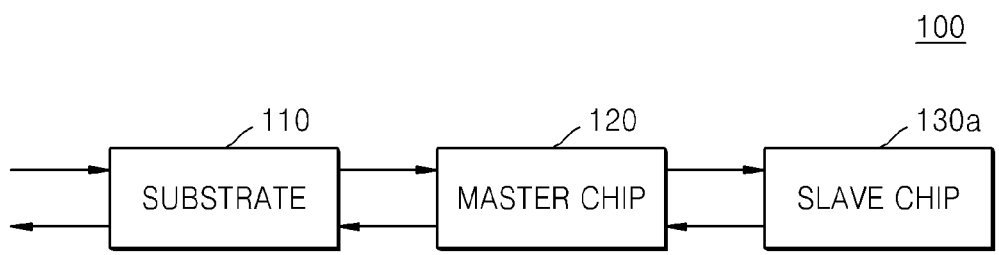
FIGS. 1A and 1B are conceptual block diagrams illustrating semiconductor packages according to at least one example embodiments of inventive concepts.

Example embodiments will be understood more readily by reference to the following detailed description and the accompanying drawings. The example embodiments may, however, be embodied in many different forms and should not be construed as being limited to those set forth herein. Rather, these example embodiments are provided so that this disclosure will be thorough and complete. In at least some example embodiments, well-known device structures and well-known technologies will not be specifically described in order to avoid ambiguous interpretation.

It will be understood that when an element is referred to as being "connected to" or "coupled to" another element, it can be directly on, connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the example embodiments.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes," and/or "including" when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which these example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Spatially relative terms, such as "below", "beneath", "lower", "above", "upper", and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

FIG. 1A is a conceptual block diagram illustrating a semiconductor package 100 according to at least one example embodiment of inventive concepts. Referring to FIG. 1A, a master chip 120 is connected to a substrate 110, and a slave chip 130a is connected to the master chip 120. In this regard, the term "connected" used herein indicates an electrical connection so as to transmit data and/or a signal.

The substrate 110 may be, for example, a printed circuit board (PCB), a lead frame, or the like. The substrate 110 may interface with an external device in order to exchange a signal and/or data therebetween and may support the master chip 120 and the slave chip 130a.

The master chip 120 and the slave chip 130a each may be a semiconductor device, in particular, a memory device. As illustrated by the arrows in FIG. 1A, the master chip 120 and the slave chip 130 may be connected in series with respect to the substrate 110. Due to the serial connection, a loading factor of the semiconductor package 100, which is related to a capacitance, may be maintained at a relatively low level.

Figure 1B:
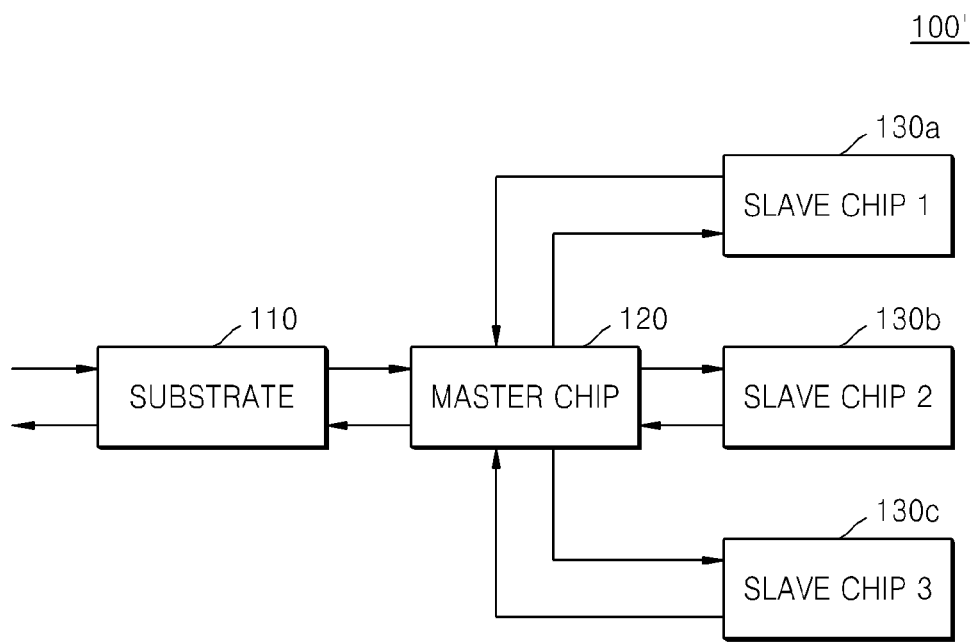

FIG. 1B is a conceptual block diagram illustrating a semiconductor package 100' according to at least one other example embodiment of inventive concepts. As illustrated in FIG. 1B, the semiconductor package 100' may include at least two slave chips (i.e., slave chips 130a, 130b and 130c).

The slave chips 130a, 130b and 130c each may be connected in series with respect to the substrate 110 and the master chip 120. Since each of the slave chips 130a, 130b and 130c is connected in series to the substrate 110 and the master chip 120, the loading factor of the semiconductor package 100' may be maintained at a relatively low level.

In FIG. 1A, the substrate 110, the master chip 120, and the slave chip 130a that constitute the semiconductor package 100 are connected by a single channel. In FIG. 1B, the substrate 110, the master chip 120, and each of the slave chips 130a, 130b and 130c that constitute the semiconductor package 100' are connected by a single channel.

Figure 2:
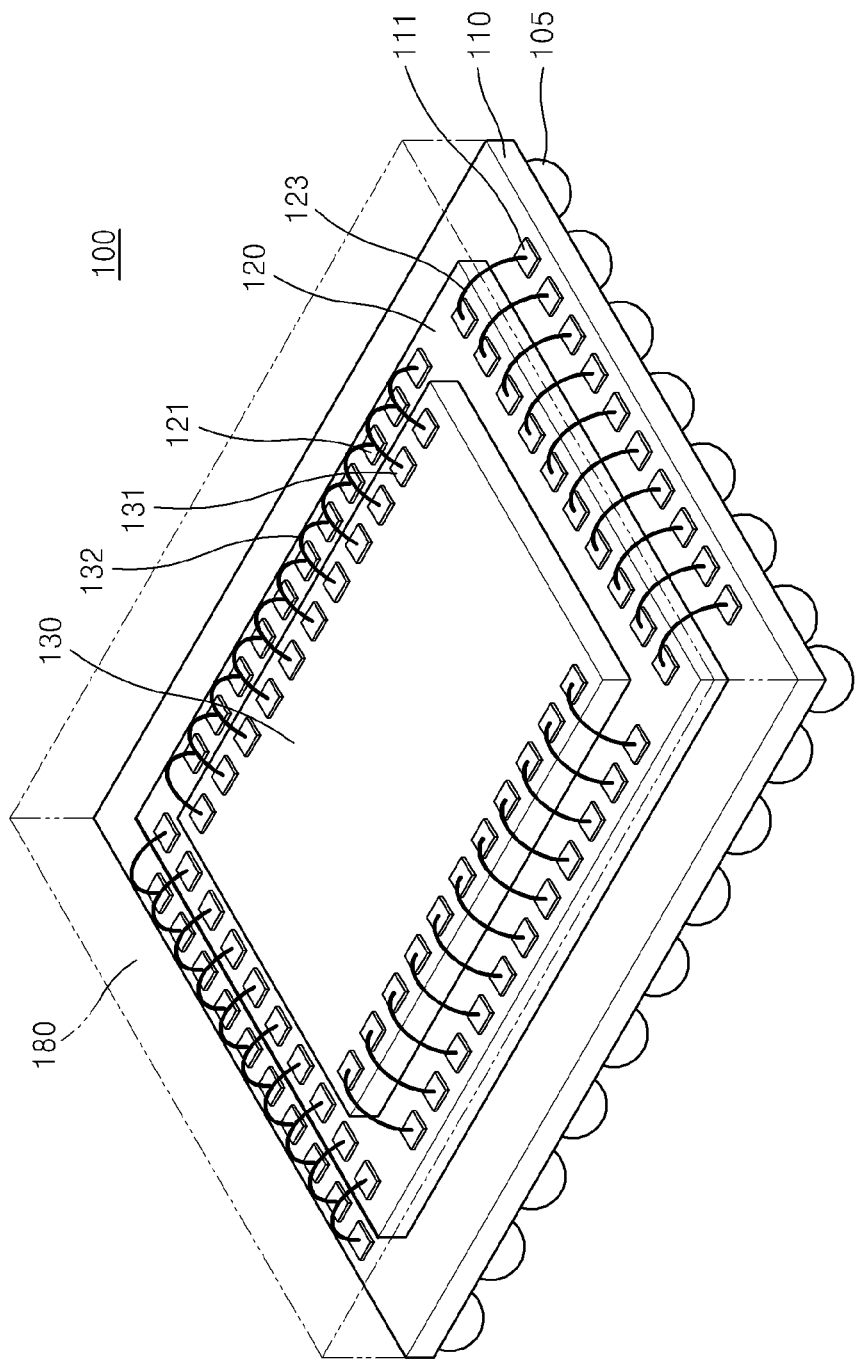
FIG. 2 is a perspective view of a semiconductor package according to at least one example embodiment of inventive concepts.

FIG. 2 is a perspective view of a semiconductor package 100 according to at least one example embodiment of inventive concepts.

Referring to FIG. 2, a master chip 120 is disposed on a substrate 110, and a slave chip 130 is disposed on the master chip 120. A footprint of the master chip 120 is substantially larger than a footprint of the slave chip 130. In other words, the master chip 120 is large enough such that an area sufficient to form bonding pads 121 of the master chip 120 around the slave chip 130 may remain.

The bonding pads 121 of the master chip 120 may be electrically connected to bonding pads 111 of the substrate 110 through bonding wires 123. The substrate 110 may be electrically connected to an external device (not shown) through a connection terminal 105. In FIG. 2, a solder ball is illustrated as the connection terminal 105, but other connection terminals may also be used.

In a case where data and/or a signal are transmitted to the master chip 120 from the external device, the data and/or the signal may be transmitted to the bonding pads 111 through the connection terminal 105 and a conductive line formed in the substrate 110. Then, the signal may be transmitted to the master chip 120 through the bonding wires 123. In a case where data and/or a signal are transmitted to the external device from the master chip 120, the data and/or the signal may be transmitted in an order opposite to the order described above.

In a case where data and/or a signal are transmitted to the slave chip 130 from the master chip 120, the data and/or the signal may be transmitted to bonding pads 131 of the slave chip 130 from the bonding pads 121 of the master chip 120 through bonding wires 132. In a case where data and/or a signal are/is transmitted to the master chip 120 from the slave chip 130, the data and/or the signal may be transmitted in an opposite to the order described above.

The master chip 120 and the slave chip 130 may be encapsulated by an encapsulating material 180 such as an epoxy molding compound (EMC) resin.

A circuit structure of the semiconductor package 100 of FIG. 2 is equivalent to that illustrated in FIG. 1A.

The master chip 120 may include a master zone for interfacing with the outside of the semiconductor package 100. The master chip 120 may further include a slave zone for performing a reading/writing operation of a memory device in the master chip 120 by interfacing with the master zone. The slave zone is electrically connected to the master zone, and thus, may transmit and receive control signals and data to and from the master zone.

The slave chip 130 is electrically connected to the master zone provided in the master chip 120, and, for this electrical connection, the semiconductor package 100 includes a conductive member that connects the slave chip 130 and the master chip 120. For example, the conductive member may be a bonding wire. The bonding wire may be an Au bonding wire or a Cu bonding wire with a heterometallic layer such as a Pd layer on its surface, but is not limited thereto.

If the slave chip 130 and the master chip 120 are connected to each other via a through silicon via (TSV) or solder balls, a total assembly time (TST) increases during mass production, and thus, the productivity of the semiconductor package 100 may decrease. Thus, as described above, the slave chip 130 and the master chip 120 may be connected to each other via bonding wires, whereby the loading factor of the semiconductor package 100 is maintained low and the semiconductor package 100 may be mass produced at low costs.

By using the bonding wires, however, the transmission of data and/or a signal may be delayed. To compensate for the delay, the master chip 120 and/or the slave chip 130 may include a driver circuit for delay compensation.

Generally, a memory core inside a DRAM chip may include a plurality of memory banks. In this regard, the memory banks may be defined as a set of memory cells that are activated simultaneously, and may be typically sectored by a bank address BA.

In a memory module including at least one DRAM chip, a rank may be defined as a set of DRAM chips that simultaneously receive the same command, the same bank address, and the same address. Generally, the rank may be defined by using a chip selection (CS) signal provided to a memory module. To efficiently access data from a memory, the concepts of the bank and the rank may be appropriately used.

The master chip 120 may include a plurality of memory banks and circuit blocks for controlling a reading/writing operation of each of the memory banks. In addition, at least one bank may be appropriately defined as a bank group. In this regard, a transmission amount of data may be increased by an interleaving operation between the bank groups.

Figure 3:
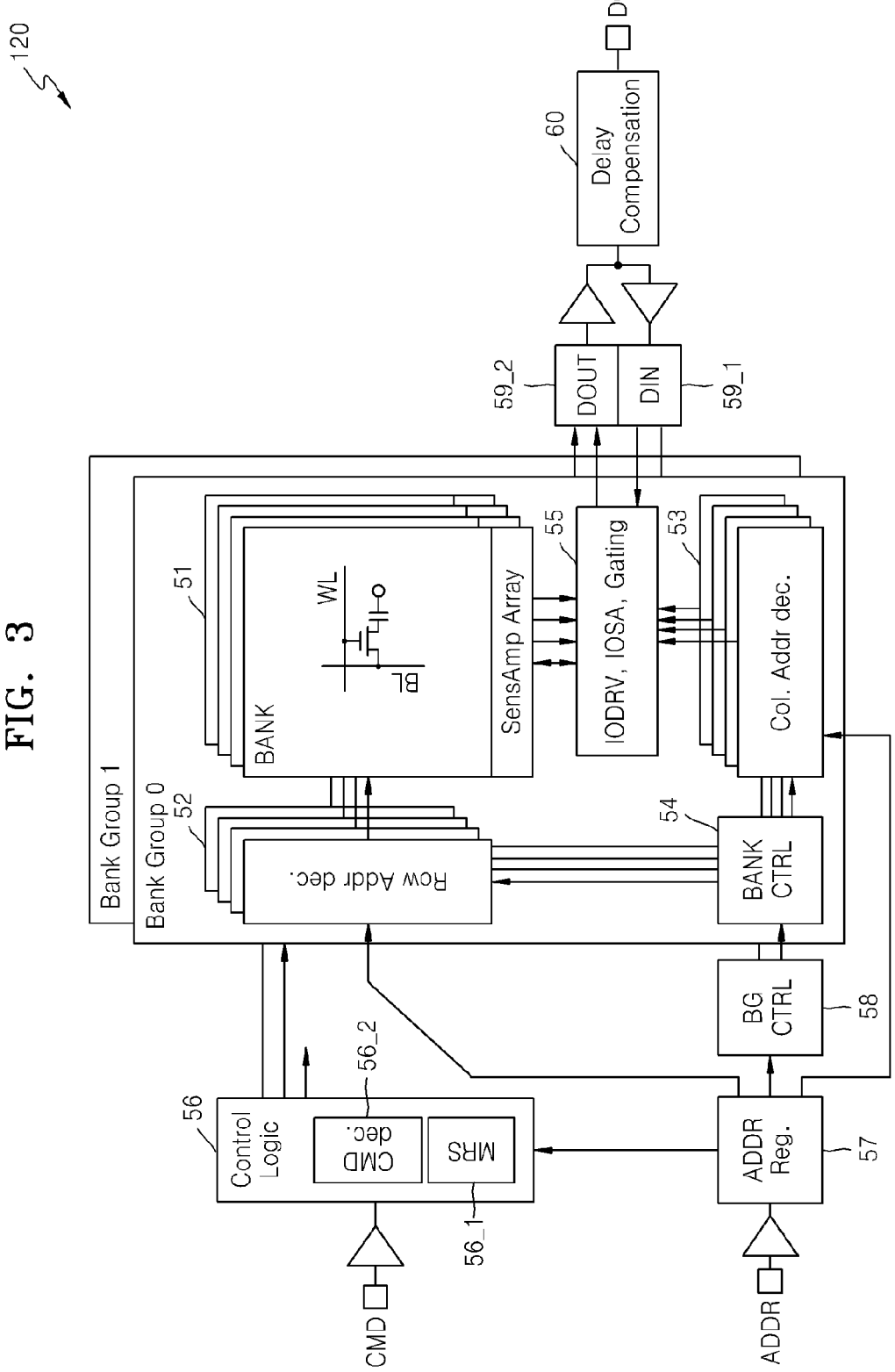
FIG. 3 is a conceptual block diagram illustrating a circuit structure of a master chip, according to at least one example embodiment of inventive concepts.

FIG. 3 is a conceptual block diagram illustrating a circuit structure of the master chip 120, according to an example embodiment of inventive concepts. Referring to FIG. 3, the master chip 120 may include a plurality of bank groups (first bank group 0 and second bank group 1). The first bank group 0 may include row address decoders 52, column address decoders 53, a bank controller 54, and an input/output driver 55, to control an operation of a plurality of memory banks 51. In addition, the master chip 120 may include a control logic 56 including a mode resistor set (MRS) 56_1 and a command decoder 56_2, an address register 57 that temporarily stores an address, a bank group control unit 58 for controlling the first and second bank groups 0 and 1, and a data input unit 59_1 and a data output unit 59_2 that are used to control input and output with respect to an external memory controller. Also, as described above with regards to FIG. 2, the master chip 120 may further include a driver circuit 60 for compensating for a delay in transmission of data or a signal.

The master chip 120 may further include circuit blocks for controlling the second bank group 1 and memory banks defined as other bank groups.

As illustrated in FIG. 3, the plurality of memory banks 51 defined as the first bank group 0 may receive write data from the input/output driver 55 or output read data to the input/output driver 55 as a result of decoding by the row address decoders 52 and the column address decoders 53 under the control of the bank controller 54. The control logic 56 may perform a decoding operation by externally receiving a command CMD, based on a setting of the mode resistor set 56_1. The address register 57 temporarily stores a received address ADDR, provides an address related to controlling of the bank groups to the bank group control unit 58, and provides a row address and a column address to the row address decoder 52 and the column address decoder 53, respectively. Data may be stored in any one of the plurality of memory banks 51 by using the write data that are received through the command CMD, the address ADDR, and the data input unit 59_1. Also, data that are read from any one of the plurality of memory banks 51 in response to the received command CMD and address ADDR may be externally output through the data output unit 59_2.

Figure 4:
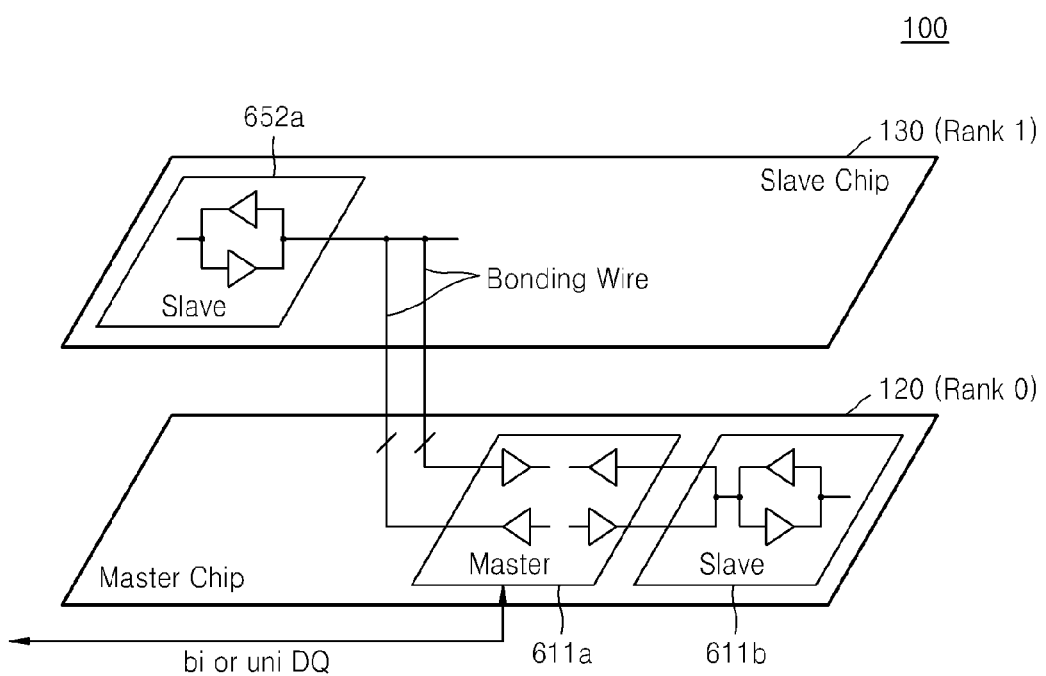
FIG. 4 is a schematic circuit diagram illustrating a data path between semiconductor chips of a semiconductor package, according to at least one example embodiment of inventive concepts.

FIG. 4 is a schematic circuit diagram illustrating a data path between semiconductor chips of a semiconductor package 100, according to at least one example embodiment of inventive concepts. As illustrated in FIG. 4, the semiconductor package 100 may include a master chip 120 and a slave chip 130. The master chip 120 includes a master zone 611a and may interface with an external device so as to transmit and receive a command/address and data to and from a slave zone 611b included in the master chip 120 and/or a slave zone 652a-652c of other chips stacked on the slave zone 611b through bonding wires. The slave chip 130 may include a memory bank and the slave zone 652a for interface between the memory bank and the master zone 611a.

According to at least one example embodiment of inventive concepts, a plurality of semiconductor chips included in the semiconductor package 100 may include a plurality of memory banks that are controlled by the master chip 120. In this regard, the memory banks included in the master chip 120 may be defined as a first rank Rank 0 and the memory banks included in the slave chip 130 may be defined as a second rank Rank 1. If additional semiconductor chips are included in the semiconductor package 100, memory banks included in the additional semiconductor chips may be defined as a third rank Rank 2, a fourth rank Rank 3, etc.

In the case where a plurality of ranks are defined in the semiconductor package 100, a data bus of the master zone 611a may be a data bus that is unidirectional or bidirectional to an external device.

Figure 5:
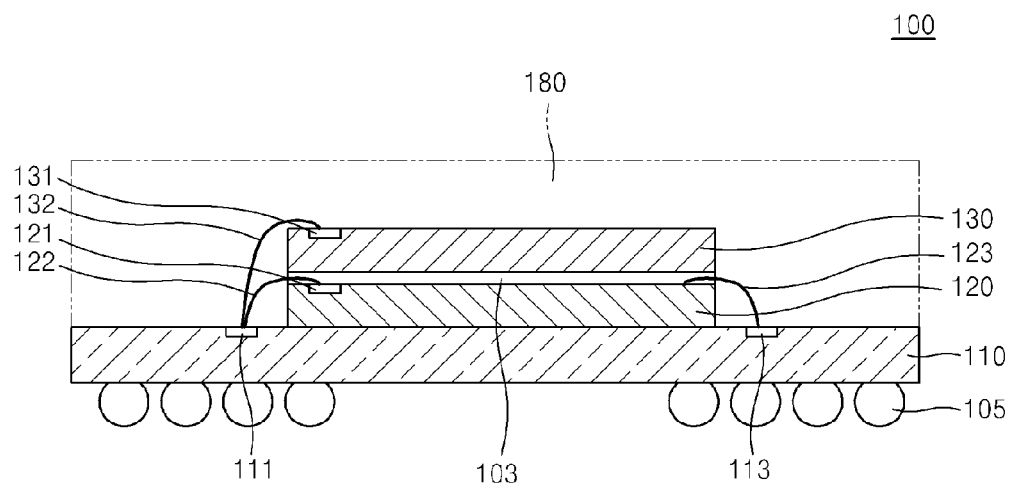
FIG. 5 is a cross-sectional side view of a semiconductor package according to at least one other example embodiment of inventive concepts.

FIG. 5 is a cross-sectional side view of a semiconductor package 100 according to another example embodiment of inventive concepts.

Referring to FIG. 5, the semiconductor package 100 includes a master chip 120 and a slave chip 130 that are sequentially stacked on a substrate 110. The master chip 120 and the slave chip 130 may be adhered to each other by an adhesion layer 103. Also, the master chip 120 may also be attached to the substrate 110 by an adhesion layer. A first bonding wire 122 that electrically connects the master chip 120 to a dummy pad 111 may penetrate the adhesion layer 103 and extend outside the master chip 120 so as to be connected to the dummy pad 111.

The master chip 120 and the slave chip 130 may have substantially the same footprint. In other words, when the slave chip 130 is stacked on the master chip 120, it is difficult to secure an area sufficient to form and expose bonding pads 121 of the master chip 120 around the slave chip 130. Thus, if it is difficult to form and expose the bonding pads 121 even though the master chip 120 has a slightly larger surface area than that of the slave chip 130, it is considered that the master chip 120 and the slave chip 130 have substantially the same footprint. In this case, bonding wire 132 of the slave chip 130 may be connected to the substrate (instead of the master chip 120 as in FIG. 2).

The master chip 120 may be electrically connected to bonding pads 113 through bonding wires 123. The bonding pads 113 in the substrate 110 may be electrically connected to an external device such as an external memory controller through a connection terminal 105. Although a solder ball is illustrated in FIG. 5 as the connection terminal 105, other connection terminals may also be used.

In a case where data and/or a signal are/is transmitted to the master chip 120 from an external device, the data and/or the signal may be transmitted to the bonding pads 113 through the connection terminal 105 and a conductive line formed in the substrate 110 and then transmitted to the master chip 120 through the bonding wires 123. In a case where data and/or a signal are/is transmitted to the external device from the master chip 120, the data and/or the signal may be transmitted in the opposite order to that described above.

In a case where data and/or a signal are transmitted to the slave chip 130 from the master chip 120, the data and/or the signal may be transmitted to the first dummy pads 111 disposed on the substrate 110 through the first bonding wires 122 and then transmitted to bonding pads 131 of the slave chip 130 through second bonding wires 132 that are connected to the first dummy pads 111. In a case where data and/or a signal are transmitted to the master chip 120 from the slave chip 130, the data and/or the signal may be transmitted in the opposite order to that described above.

As described above, the master chip 120 and the slave chip 130 may exchange data and/or a signal through the first dummy pads 111.

The first dummy pads 111 are not electrically connected to other conductive lines formed in the substrate 110 and/or the connection terminal 105. In addition, the first dummy pads 111 are functionally distinguished from the bonding pads 113 on the substrate 110 that are electrically connected to other conductive lines formed in the substrate 110 and/or the connection terminal 105. Since the first dummy pads 111 are not electrically connected to other wires formed in the substrate 110 and/or the connection terminal 105, they only act as a mediator for electrical connection through bonding wires between the master chip 120 and the slave chip 130.

In the semiconductor package 100 of FIG. 5, the substrate 110, the master chip 120, and the slave chip 130 are connected in series to one another in terms of a circuit configuration, and thus, when this configuration is illustrated as a block diagram, the semiconductor package 100 has a single channel structure as illustrated in FIG. 1A.

The master chip 120 and the slave chip 130 may be encapsulated by an encapsulating material 180 such as epoxy molding compound (EMC).

Figure 6:
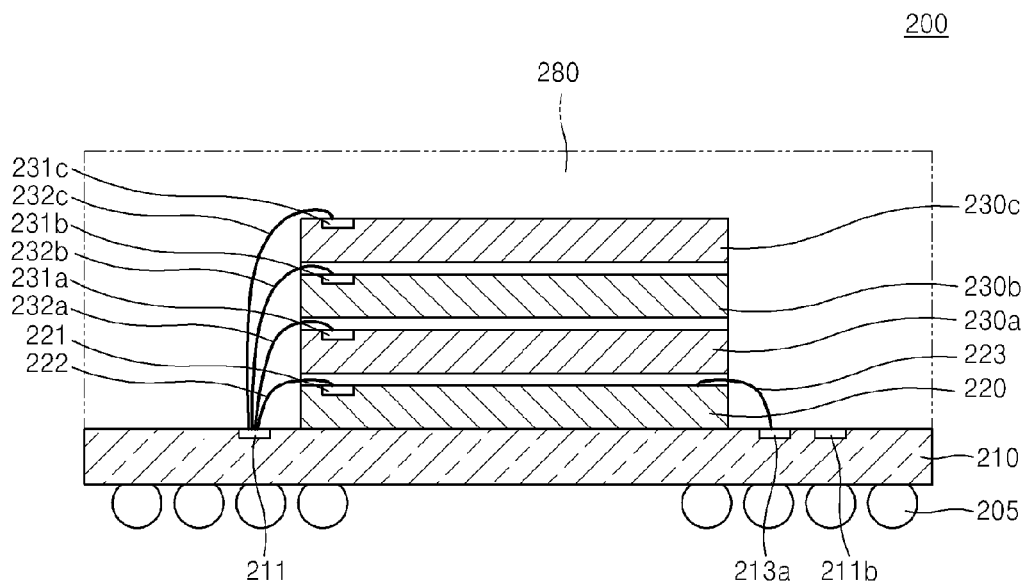
FIG. 6 is a cross-sectional side view of a semiconductor package according to at least one other example embodiment of inventive concepts.
Figure 7:
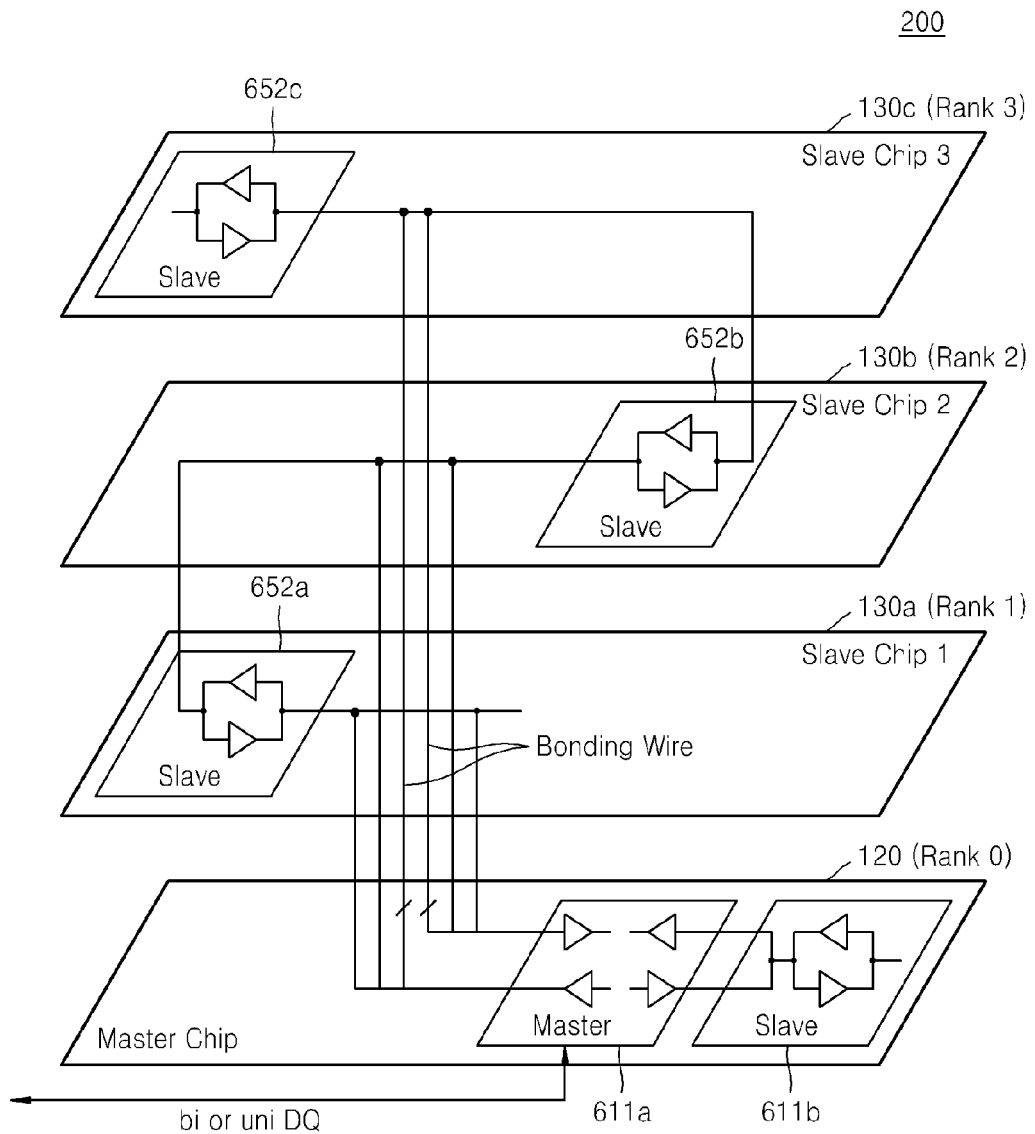
FIG. 7 is a schematic circuit diagram illustrating a data path between semiconductor chips of the semiconductor package of FIG. 6.

FIG. 6 is a cross-sectional side view of a semiconductor package 200 according to at least another example embodiment of inventive concepts. FIG. 7 is a circuit diagram illustrating a circuit configuration of the semiconductor package 200 of FIG. 6.

Referring to FIGS. 6 and 7, a master chip 220 is stacked on a substrate 210, and a first slave chip 230a, a second slave chip 230b, and a third slave chip 230c may be sequentially stacked on the master chip 220.

The master chip 220 may be electrically connected to bonding pads 213a of the substrate 210 through bonding wires 223. The substrate 210 may be electrically connected to an external device such as an external memory controller through a connection terminal 205. Although a solder ball is illustrated in FIG. 6 as the connection terminal 205, other kinds of connection terminals may also be used.

In a case where data and/or a signal are transmitted to the master chip 220 from an external device, the data and/or the signal may be transmitted to the bonding pads 213 through the connection terminal 205 and a conductive line formed in the substrate 210 and then transmitted to the master chip 220 through the bonding wires 223. In a case where data and/or a signal are transmitted to the external device from the master chip 220, the data and/or the signal may be transmitted in the opposite order to that described above.

In a case where data and/or a signal are transmitted to the first slave chip 230a from the master chip 220, the data and/or the signal may be transmitted to first dummy pads 211 disposed on the substrate 210 through first bonding wires 222 and then transmitted to bonding pads 231a of the first slave chip 230a through second bonding wires 232a that are connected to the first dummy pads 211. In a case where data and/or a signal are transmitted to the master chip 220 from the first slave chip 230a, the data and/or the signal may be transmitted in the opposite order to that described above.

In a case where data and/or a signal are transmitted to the second slave chip 230b from the master chip 220, as illustrated in FIG. 7, the data and/or the signal may be directly transmitted to the second slave chip 230b not through the first slave chip 230a. In this case, the data and/or the signal are directly transmitted to the second slave chip 230b through third bonding wires 232b. To directly transmit data and/or a signal to the second slave chip 230b, the second slave chip 230b may be controlled to be in an ON state by a chip selection (CS) signal so as to be activated.

In a case where data and/or a signal are transmitted to the third slave chip 230c from the master chip 220, the data and/or a signal may be directly transmitted to the third slave chip 230c through the first dummy pads 211 and fourth bonding wires 232c in the same manner as described above.

By having such a circuit configuration, the circuit configuration of FIG. 7 has a series-connected single channel structure as illustrated in FIG. 1B.

Figure 8:
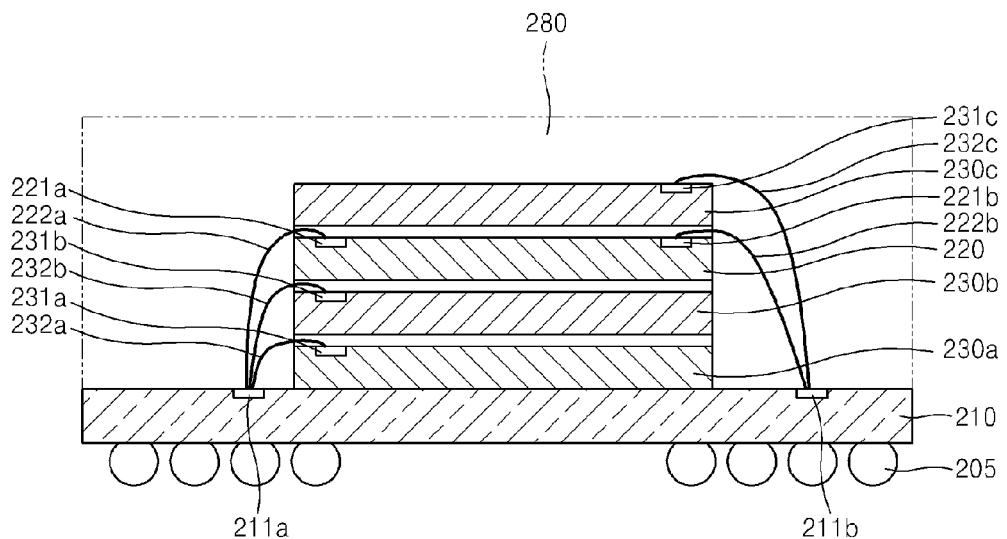
FIGS. 8 and 9 are cross-sectional views each illustrating a semiconductor package according to at least one other example embodiment of inventive concepts.

FIG. 8 is a cross-sectional side view illustrating a semiconductor package 200a according to at least one example embodiment of inventive concepts.

Referring to FIG. 8, a master chip 220 is not directly stacked on a substrate 210, and a first slave chip 230a and a second slave chip 230b may be first stacked on the substrate 210, and the master chip 220 may be stacked thereon. A third slave chip 230c may be stacked on the master chip 220.

The master chip 220, the first slave chip 230a, and the second slave chip 230b each may be connected to first dummy pads 211a disposed on the substrate 210. In particular, the master chip 220, the first slave chip 230a, and the second slave chip 230b may be connected to the first dummy pads 211a through first bonding wires 222a, second bonding wires 232a, and third bonding wires 232b, respectively. Bonding pads 221a, bonding pads 231a, and bonding pads 231b may be disposed on the master chip 220, the first slave chip 230a, and the second slave chip 230b, respectively, so as to be connected to the first dummy pads 211a.

Transmission of data and/or a signal according to a connection relationship between the substrate 210, the master chip 220, the first slave chip 230a, and the second slave chip 230b is the same as described above with reference to FIG. 6, and thus, a detailed description thereof is not provided here. In FIG. 8, however, bonding wires through which data and/or a signal from the outside is transmitted from the substrate 210 to the master chip 220 are not illustrated.

The master chip 220 and the third slave chip 230c may be connected to second dummy pads 211b disposed on the substrate 210 through fourth bonding wires 222b and fifth bonding wires 232c, respectively.

In a case where data and/or a signal are/is transmitted to the third slave chip 230c from the master chip 220, the data and/or the signal may be transmitted to the second dummy pads 211b through other bonding pads 221b disposed on the master chip 220 and then transmitted to the third slave chip 230c through the fifth bonding wires 232c and bonding pad 231c.

Figure 9:
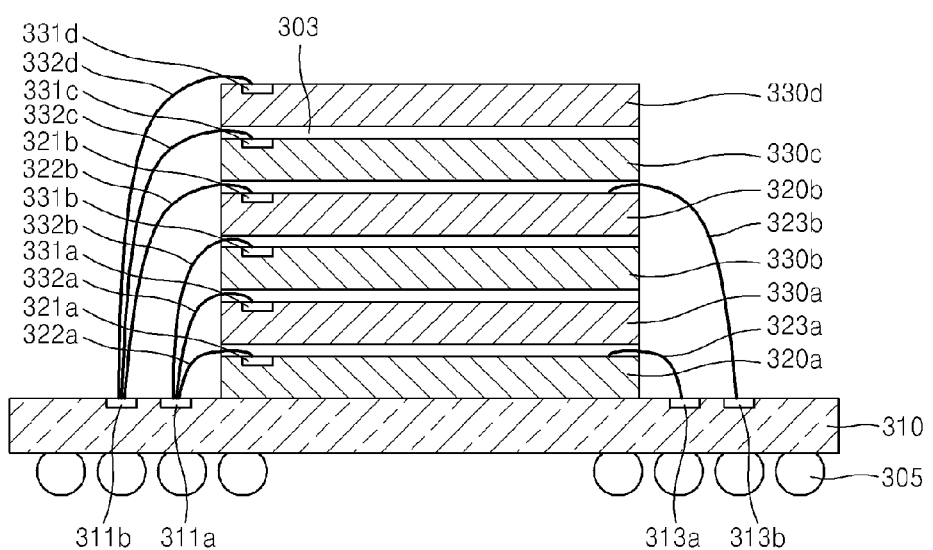

FIG. 9 is a cross-sectional side view illustrating a semiconductor package 300 according to another embodiment of the inventive concept.

As illustrated in FIG. 9, a first master chip 320a, a first slave chip 330a, and a second slave chip 330b may be sequentially stacked on a substrate 310. Similarly as described above with reference to FIG. 8, the first master chip 320a, the first slave chip 330a, and the second slave chip 330b may be electrically connected to first dummy pads 311a through first bonding wires 322a, second bonding wires 332a, and third bonding wires 332b, respectively. The first master chip 320a may receive data and/or a signal from the outside through bonding pads 313a and bonding wires 323a and transmit the data and/or the signal to the first slave chip 330a and the second slave chip 330b through the first bonding wires 322a, the first dummy pads 311a, the second bonding wires 332a, and/or the third bonding wires 332b.

Also, a second master chip 320b, a third slave chip 330c, and a fourth slave chip 330d may be sequentially stacked on the second slave chip 330b. The second master chip 320b, the third slave chip 330c, and the fourth slave chip 330d may be electrically connected to second dummy pads 311b disposed on the substrate 310 through fourth bonding wires 322b, fifth bonding wires 332c, and sixth bonding wires 332d, respectively. The second master chip 320b may receive data and/or a signal from the outside through bonding pads 313b and bonding wires 323b and transmit the data and/or the signal to the third slave chip 330c and the fourth slave chip 330d through the fourth bonding wires 322b, the second dummy pads 311b, the fifth bonding wires 332c, and/or the sixth bonding wires 332d.

In this regard, the first master chip 320a, the first slave chip 330a, and the second slave chip 330b may constitute a first semiconductor chip group, and the second master chip 320b, the third slave chip 330c, and the fourth slave chip 330d may constitute a second semiconductor chip group.

Further, the first and second master chips 320a and 320b and the slave chips 330a, 330b, 330c, and 330d may be adhered to each other by an adhesion layer 303. Also, the first master chip 320a may also be attached to the substrate 310 by an adhesion layer (not shown). Bonding wires 323a, 323b, that electrically connect the first and second master chips 320a and 320b to bonding pads 313a and 313b may penetrate the adhesion layer 303 and extend outside the first and second master chip 320a and 320b so as to be connected to the bonding pads 313a and 313b. Likewise, bonding wires 322a, 332a, 332b, 322b, and 332c that electrically connect other bonding pads 321a, 331a, 331b, 321b, 331c, and 331d to first and second dummy pads 311a and 311b may penetrate the adhesion layer 303 and extend outside the master chips and slave chips so as to be connected to the first and second dummy pads 311a and 311b.

In the first and second semiconductor chip groups, semiconductor chips constituting the first and second semiconductor chip groups are connected in series to each other through bonding wires, and thus, they have a low loading factor and may be mass produced at low costs. In addition, two semiconductor chip groups may be mounted on a single substrate (i.e., substrate 310), whereby the semiconductor package 300 is advantageous in terms of high capacity.

Figure 10:
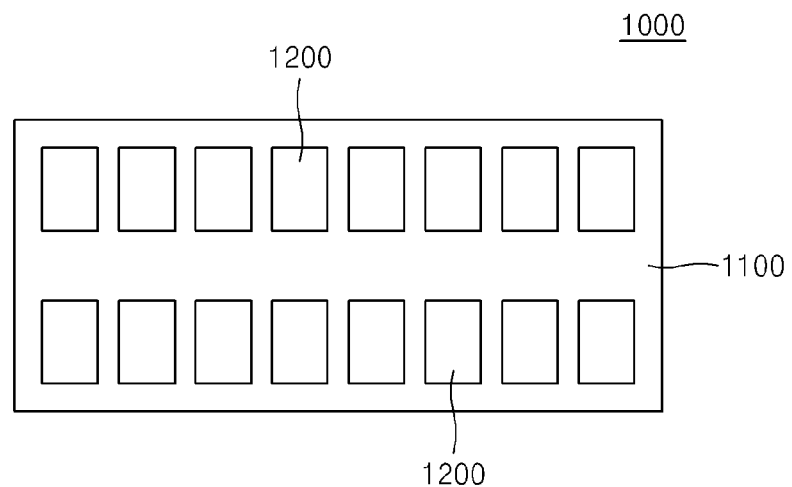
FIG. 10 is a plan view of a memory module including a semiconductor package according to an at least one example embodiment of inventive concepts.

FIG. 10 is a plan view of a memory module 1000 including a semiconductor package according to at least one example embodiment of inventive concepts.

In particular, the memory module 1000 may include a printed circuit board 1100 and a plurality of semiconductor packages 1200.

The plurality of semiconductor packages 1200 may be or may include semiconductor packages according to at least one of the above described example embodiments of inventive concepts.

The memory module 1000 may be a single in-lined memory module (SIMM) in which the plurality of semiconductor packages 1200 are mounted on only a surface of the printed circuit board 1100 or a dual in-lined memory module (DIMM) in which the plurality of semiconductor packages 1200 are arranged on both surfaces of the printed circuit board 1100. In addition, the memory module 1000 may be a fully buffered DIMM having advanced memory buffers (AMBs) that provide signals from the outside to the plurality of semiconductor packages 1200.

Figure 11:
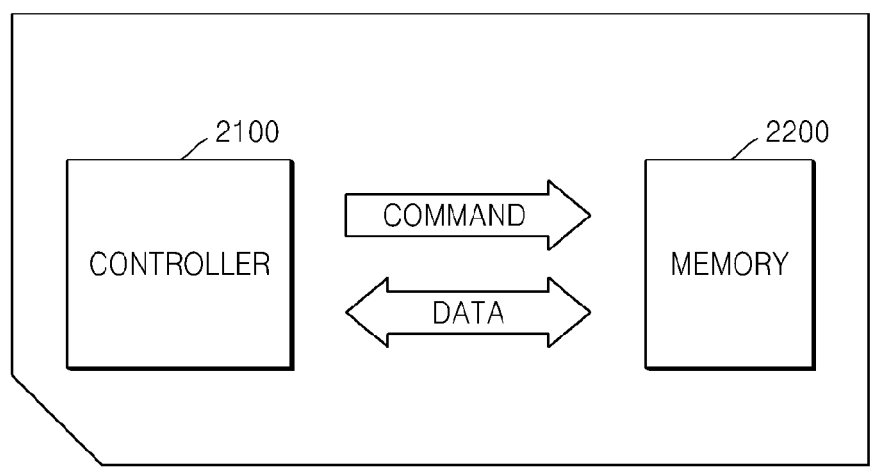
FIG. 11 is a schematic view of a memory card including a semiconductor package according to at least one example embodiment of inventive concepts.

FIG. 11 is a schematic view of a memory card 2000 including a semiconductor package according to at least one example embodiment of inventive concepts.

In particular, the memory card 2000 may be configured so that a controller 2100 and a memory 2200 exchange an electrical signal. For example, when the controller 2100 sends a command to the memory 2200, the memory 2200 may transmit data.

The memory 2200 may include a semiconductor package according to one or more of the above described example embodiments of inventive concepts.

The memory card 2000 may include various kinds of memory cards, such as a memory stick card, a smart media (SM) card, a secure digital (SD) card, mini-secure digital (mini SD) card, a multimedia card (MMC), etc.

Figure 12:
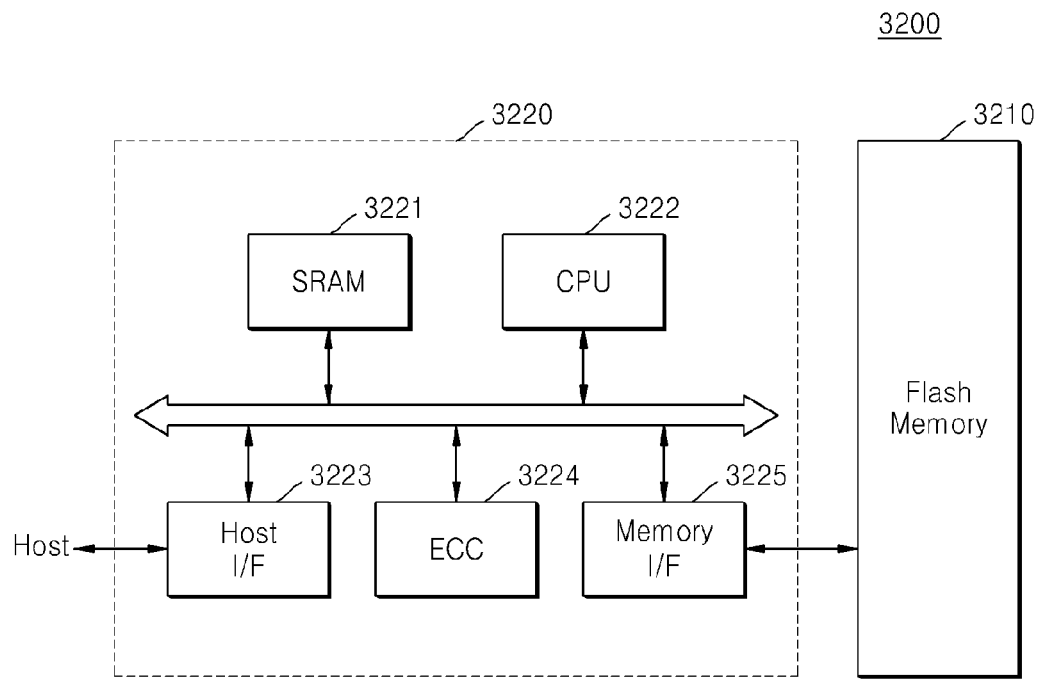
FIG. 12 is a block diagram illustrating a memory device including a semiconductor package according to at least one example embodiment of inventive concepts.

FIG. 12 is a block diagram illustrating a memory device 3200 including a semiconductor package according to at least one example embodiment of inventive concepts.

Referring to FIG. 12, the memory device 3200 includes a memory module 3210. The memory module 3210 may include at least one of the above described semiconductor packages. The memory module 3210 may further include other kinds of semiconductor memory devices (e.g., a non-volatile memory device and/or an SRAM device). The memory device 3200 may include a memory controller 3220 for controlling data exchange between a host and the memory module 3210.

The memory controller 3220 may include a processing unit 3222 that controls an overall operation of a memory card. In addition, the memory controller 3220 may include an SRAM 3221 used as an operation memory of the processing unit 3222. The memory controller 3220 may further include a host interface 3223 and a memory interface 3225. The host interface 3223 may include a protocol for data exchange between the memory device 3200 and the host. The memory controller 3220 may interface with the memory module 3210 via the memory interface 3225. The memory controller 3220 may further include an error check correction (ECC) block 3224. The error check correction block 3224 may detect and correct an error of data read from the memory module 3210. The memory device 3200 may further include a ROM device that stores code data for interfacing with the host. The memory device 3200 may be embodied as a solid state drive (SSD) that may replace a hard disk of a computer system.

Figure 13:
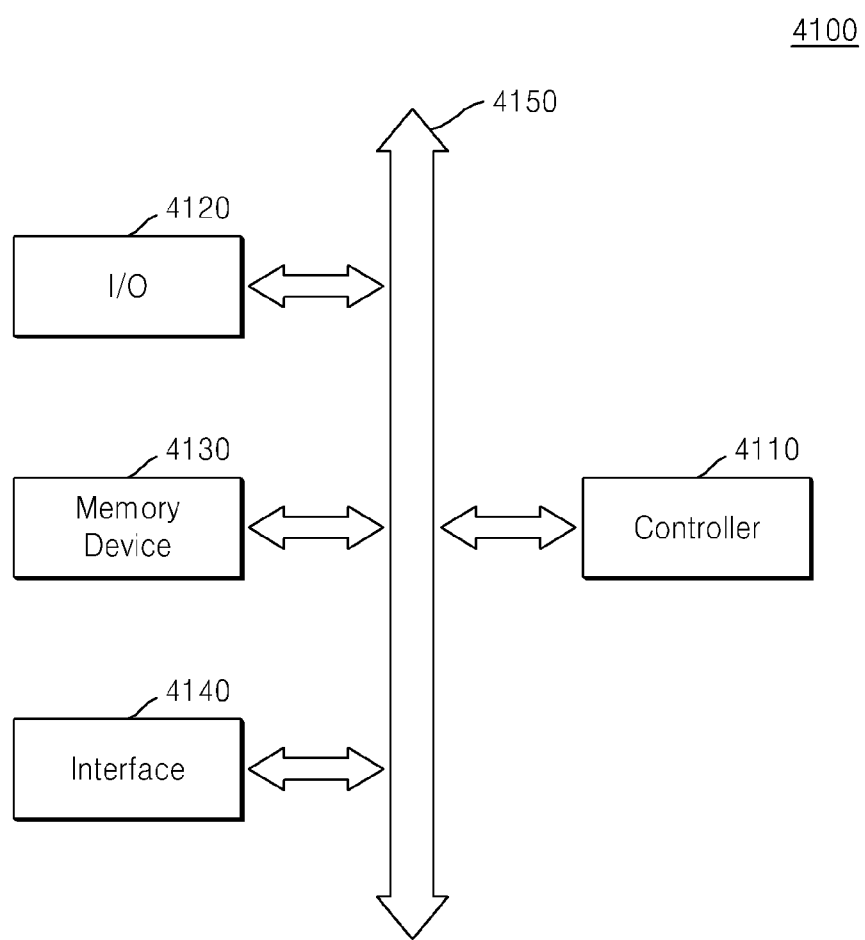
FIG. 13 is a block diagram illustrating an electronic system including a semiconductor package according to at least one example embodiment of inventive concepts.

FIG. 13 is a block diagram illustrating an electronic system 4100 including a semiconductor package according to at least one example embodiment of inventive concepts.

As illustrated in FIG. 13, the electronic system 4100 may include a controller 4110, an input/output (I/O) device 4120, a memory device 4130, an interface 4140, and a bus 4150. The controller 4110, the I/O device 4120, the memory device 4130, and/or the interface 4140 may be connected to one another through the bus 4150. The bus 4150 is a path for data transfer.

The controller 4110 may include at least one of a microprocessor, a digital signal processor, a microcontroller, and logic devices capable of performing similar functions. The I/O device 4120 may include a keypad, a keyboard, and a display device. The memory device 4130 may store data and/or a command. The memory device 4130 may include at least one of the semiconductor packages described above. In addition, the memory device 4130 may further include other kinds of semiconductor memory devices (e.g., a nonvolatile memory device and/or an SRAM device). The interface 4140 may transmit data to a communications network or receive data from the communications network. The interface 4140 may be wired or wireless. For example, the interface 4140 may include an antenna or a wired or wireless transceiver. Although not illustrated in FIG. 13, the electronic system 4100 may further include a high-speed DRAM device and/or SRAM device as an operation memory device for improving an operation of the controller 4110.

The electronic system 4100 may be applied to a personal digital assistance (PDA), a portable computer, a web tablet, a wireless phone, a mobile phone, a digital music player, a memory card, and any kind of electronic products capable of receiving and/or transmitting information wirelessly.

While inventive concepts have been particularly shown and described with reference to exemplary embodiments thereof, it will be understood that various changes in form and details may be made therein without departing from the spirit and scope of the following claims.

What is claimed is:

1. A semiconductor package, comprising:
a master chip and a slave chip stacked on a substrate, wherein the master chip and the slave chip are connected in series with respect to an external circuit;
a first dummy pad on the substrate;
at least one first bonding wire connecting the master chip and the first dummy pad; and
at least one second bonding wire connecting the slave chip and the first dummy pad.

2. The semiconductor package of claim 1, wherein the master chip comprises a control circuit configured to control data and a signal input to and output from the slave chip.

3. The semiconductor package of claim 1, wherein a footprint of the master chip is substantially the same as a footprint of the slave chip.

4. The semiconductor package of claim 3, wherein the master chip and the slave chip are configured to communicate with each other through the first dummy pad.

5. The semiconductor package of claim 3, wherein the slave chip is at least two slave chips, and each of the at least two slave chips is connected in series to the substrate and the master chip.

6. The semiconductor package of claim 5, wherein the at least one second bonding wire includes a plurality of second bonding wires, and each of the at least two slave chips is connected to the first dummy pad by one of the plurality of second bonding wires.

7. The semiconductor package of claim 5, further comprising:
a second dummy pad on the substrate, wherein the at least one first bonding wire includes a plurality of first bonding wires, the master chip being connected to the first dummy pad and the second dummy pad by at least some of the plurality of first bonding wires, and the at least two slave chips being connected to any one of the first dummy pad and the second dummy pad.

8. The semiconductor package of claim 5, wherein the master chip and the at least two slave chips are connected to each other by a single channel.

9. The semiconductor package of claim 1, wherein the master chip is directly on the substrate, and a footprint of the master chip is substantially larger than a footprint of the slave chip.

10. The semiconductor package of claim 1, wherein at least one of the master chip and the slave chip comprises a driver circuit configured to compensate for a delay in transmission of data or a signal.

11. A semiconductor package, comprising:
 a master chip and a slave chip stacked on a substrate, wherein the master chip and the slave chip are connected in series with respect to an external circuit and connected through a dummy pad disposed on the substrate.

12. The semiconductor package of claim 11, wherein a footprint of the master chip is substantially the same as a footprint of the slave chip.

13. The semiconductor package of claim 12, further comprising:
 a first bonding wire connecting the master chip and the dummy pad; and
 a second bonding wire connecting the slave chip and the dummy pad.

14. The semiconductor package of claim 11, wherein the master chip is at least two master chips and the slave chip is at least two slave chips, and the at least two master chips and the at least two slave chips are connected in series.

15. A semiconductor package, comprising:
 a first chip group, including,
  a first master chip and at least one first slave chip stacked on a substrate,
  at least one first bonding wire connecting the first master chip to a first bonding pad on the substrate, and
  at least one second bonding wire connecting the at least one first slave chip to a second bonding pad on the substrate, the at least one second bonding wire being located on a different edge of the first master chip than the at least one first bonding wire, and the first master chip and the at least one first slave chip being connected in series with one another and an external circuit.

16. The semiconductor package of claim 15, further comprising:
 a second chip group stacked on the first chip group, the second chip group including,
  at least one second slave chip and a second master chip on the first chip group,
  at least one third bonding wire connecting the second master chip to a third bonding pad on the substrate, and
  at least one fourth bonding wire connecting the at least one second slave chip to a fourth bonding pad on the substrate, the at least one fourth bonding wire being located on a different edge of the second master chip than the at least one third bonding wire, and the second master chip and the at least one second slave chip being connected in series with one another and the external circuit.

17. The semiconductor package of claim 16, wherein the at least one first slave chip and the at least one second slave chip each include a plurality of slave chips, and the at least one second bonding wire and the at least one fourth bonding wire each include a plurality of bonding wires connecting each of the plurality of slave chips to the second bonding pads and the fourth bonding pads, respectively.

18. The semiconductor package of claim 16, wherein the at least one first bonding wire and the at least one third bonding wire are configured to transmit signals between the external circuit and the first and second master chips.

19. The semiconductor packet of claim 16, wherein the first chip group and the second chip group have a substantially same footprint.

* * * * *